United States Patent
Van De Meerendonk et al.

(10) Patent No.: US 12,411,424 B2
(45) Date of Patent: Sep. 9, 2025

(54) TEMPERATURE CONDITIONING SYSTEM, A LITHOGRAPHIC APPARATUS AND A METHOD OF TEMPERATURE CONDITIONING AN OBJECT

(71) Applicant: ASML NETHERLANDS B.V., Veldhoven (NL)

(72) Inventors: Remco Van De Meerendonk, 's-Hertogenbosch (NL); Daniel Jozef Maria Direcks, Simpelveld (NL); Güneş Nakiboğlu, Eindhoven (NL); Nicholas Peter Waterson, Veldhoven (NL); Joost André Klugkist, Waalre (NL); Sven Pekelder, Breugel (NL); Antonius Johannus Van Der Net, Tilburg (NL); Johannes Henricus Wilhelmus Jacobs, Heeze (NL); Jaap Oudes, Eindhoven (NL); Gerardus Arnoldus Hendricus Franciscus Janssen, Eindhoven (NL); Jeroen Peterus Johannes Van Lipzig, Beesel (NL); Johannes Franciscus Martinus Van Santvoort, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 184 days.

(21) Appl. No.: 18/284,608

(22) PCT Filed: Mar. 22, 2022

(86) PCT No.: PCT/EP2022/057476
§ 371 (c)(1),
(2) Date: Sep. 28, 2023

(87) PCT Pub. No.: WO2022/223220
PCT Pub. Date: Oct. 27, 2022

(65) Prior Publication Data
US 2024/0176255 A1 May 30, 2024

(30) Foreign Application Priority Data

Apr. 21, 2021 (EP) .................................... 21169681
Jun. 10, 2021 (EP) .................................... 21178831
Nov. 19, 2021 (EP) .................................... 21209310

(51) Int. Cl.
G03F 7/00 (2006.01)
(52) U.S. Cl.
CPC ............................. G03F 7/70891 (2013.01)
(58) Field of Classification Search
CPC .. G03F 7/70875; F16L 55/052; G02B 7/1815; F04B 11/0025
See application file for complete search history.

(56) References Cited

U.S. PATENT DOCUMENTS 4,408,960 A * 10/1983 Allen ........................ F04F 1/10
417/54
5,998,889 A 12/1999 Novak
(Continued)

FOREIGN PATENT DOCUMENTS

| EP | 1843206 | 10/2007 |
|---|---|---|
| WO | 2005/071491 | 8/2005 |
| WO | 2012/029998 | 9/2011 |

OTHER PUBLICATIONS

International Search Report and Written Opinion issued in corresponding PCT Patent Application No. PCT/EP2022/057476, dated May 30, 2022.

*Primary Examiner* — Eric S Ruppert
(74) *Attorney, Agent, or Firm* — Pillsbury Winthrop Shaw Pittman, LLP

(57) ABSTRACT

A temperature conditioning system using conditioning liquid to condition a temperature of an object, the system including a conditioning conduit, a return conduit, a supply chamber, and a discharge chamber, wherein the temperature
(Continued)

conditioning system is arranged to provide a static pressure difference between the supply chamber outlet and the discharge chamber inlet to create a flow through the conditioning conduit. A lithography apparatus and a method of temperature conditioning an object is also described.

20 Claims, 8 Drawing Sheets

(56) References Cited

U.S. PATENT DOCUMENTS

| | | |
|---|---|---|
| 6,952,253 B2 | 10/2005 | Lof et al. |
| 2007/0031274 A1* | 2/2007 | Hatta ............... F16L 55/053 417/540 |
| 2008/0129969 A1 | 6/2008 | Peng et al. |
| 2018/0247839 A1 | 8/2018 | Kurasaki et al. |

* cited by examiner

TEMPERATURE CONDITIONING SYSTEM, A LITHOGRAPHIC APPARATUS AND A METHOD OF TEMPERATURE CONDITIONING AN OBJECT

CROSS-REFERENCE TO RELATED APPLICATIONS

This application is the U.S. national phase entry of PCT Patent Application No. PCT/EP2022/057476 which was filed on Mar. 22, 2022, which claims priority of European Patent Application No. 21169681.0 which was filed on Apr. 21, 2021, of European Patent Application No. 21178831.0 which was filed on Jun. 10, 2021, and of European Patent Application No. 21209310.8 which was filed on 19 Nov. 19, 2021, which are incorporated herein in their entireties by reference.

FIELD

The present invention relates to a temperature conditioning system, a lithographic apparatus and a method of temperature conditioning an object.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

With increasing demands on focus and overlay in the lithographic process, stability of critical objects of the lithographic is increasingly important. These critical objects for example include mirror elements of the projection system of the lithographic apparatus. The stability of the objects relates to the position of the objects, such as vibrations of objects, as well as dealing with temperature effects, such as deformation due to thermal stresses in the (critical) objects.

Mirror elements are used in the projection system to reflect a patterned radiation beam. This reflection results in a substantial heat load of the radiation beam on the mirror elements. This heat load may cause internal thermal stresses that may lead to deformation of the mirror elements. In a known embodiment of a lithographic apparatus, pre-heating systems are used to condition the temperature of an object, such as a mirror element to control the thermal stresses. These pre-heating systems do not always provide sufficient temperature control of the mirror elements.

As an alternative, temperature conditioning with a conditioning liquid is used to control the temperature of one or more objects in the lithographic apparatus. Such temperature conditioning comprises at least one conditioning conduit, usually a network of conditioning conduits, that runs through or along the object of which the temperature should be conditioned. The temperature conditioning system comprises a tank holding a relatively large quantity of conditioning liquid at a predetermined temperature and a pump to pump the conditioning liquid through the at least one conditioning conduit.

A drawback of the temperature conditioning system is that the pump action of the pump creates pressure fluctuations that are propagated through the conditioning liquid. These pressure fluctuations may cause vibrations of the object to be conditioned. These flow induced vibrations in the object, for example vibrations of a mirror element of the projection system may have a negative effect on the focus and/or overlay performance of the lithographic apparatus. A further drawback is that the pressure of the conditioning liquid influences in the surface figure deformations of the mirror element, which may have a further negative effect on the focus and/or overlay performance of the lithographic apparatus. Another source creating pressure fluctuations in the liquid are accelerations of parts of the liquid system caused by machine part vibrations and/or floor vibrations the fluid parts are mounted on.

SUMMARY

It is an object of the invention to provide a thermal conditioning system for an object to be thermally conditioned, in particular a thermal conditioning system using a conditioning liquid, wherein flow induced vibrations within the object caused by pressure fluctuations in the flow of conditioning liquid may be substantially reduced. It is a further object of the invention to provide such thermal conditioning system for use in a lithographic apparatus and a method of temperature conditioning an object using conditioning liquid in a temperature conditioning system.

According to an aspect of the invention, there is provided a temperature conditioning system using conditioning liquid to condition a temperature of an object, comprising:
  a conditioning conduit to guide conditioning liquid through or along the object, the conditioning conduit comprising a conditioning conduit inlet and a conditioning conduit outlet,
  a return conduit having a return conduit inlet and a return conduit outlet,
  a supply chamber having a supply chamber inlet connected to the return conduit outlet and a supply chamber outlet connected to the conditioning conduit inlet, and
  a discharge chamber having a discharge chamber inlet connected to the conditioning conduit outlet and a discharge chamber outlet connected to the return conduit inlet,
  wherein the temperature conditioning system is arranged to provide a static pressure difference between the supply chamber outlet and the discharge chamber inlet to create a flow through the conditioning conduit.

In an embodiment of the previous aspect of the invention, a first pressure in the supply chamber and a second pressure in the discharge chamber are held at a sub-atmospheric pressure level.

According to an aspect of the invention, there is provided a lithographic apparatus comprising a temperature conditioning system using conditioning liquid to condition a temperature of an object, wherein the object is a part of the lithographic apparatus.

According to an aspect of the invention, there is provided a method of temperature conditioning an object using conditioning liquid in a temperature conditioning system, the temperature conditioning system comprising:

a conditioning conduit to guide conditioning liquid through or along the object, the conditioning conduit comprising a conditioning conduit inlet and a conditioning conduit outlet, a return conduit having a return conduit inlet and a return conduit outlet, a supply chamber having a supply chamber inlet connected to the return conduit outlet and a supply chamber outlet connected to the conditioning conduit inlet, and a discharge chamber having a discharge chamber inlet connected to the conditioning conduit outlet and a discharge chamber outlet connected to the return conduit inlet, wherein the method comprises providing a static pressure difference between the supply chamber outlet and the discharge chamber inlet to create a flow through the conditioning conduit.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
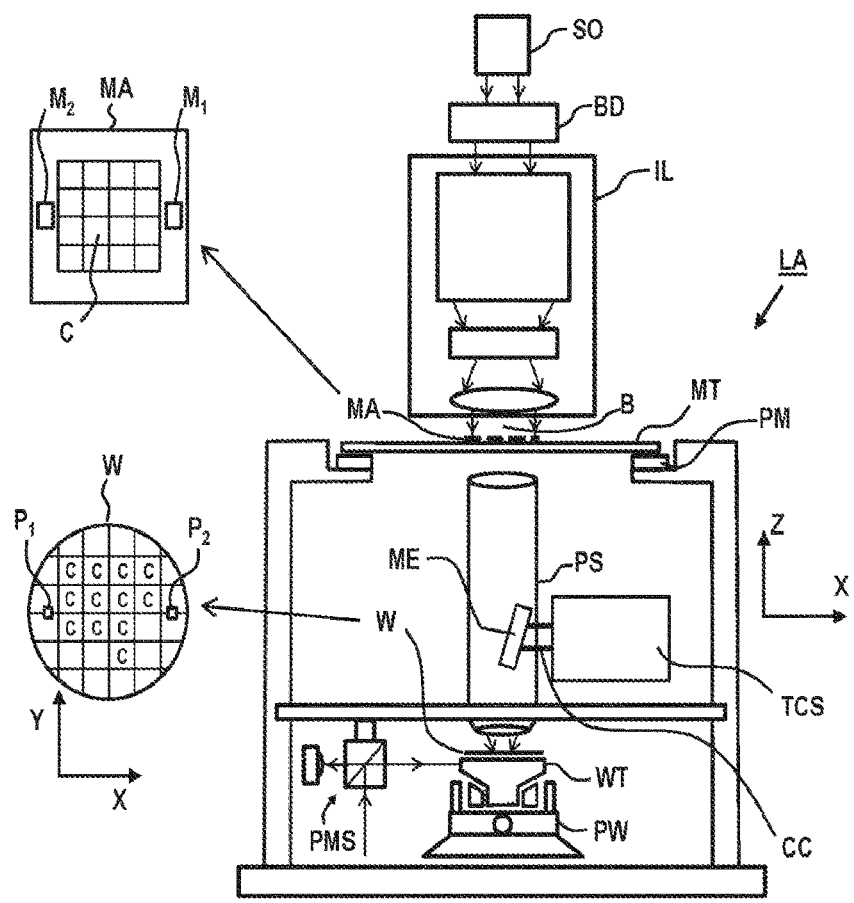
FIG. 1 depicts a schematic overview of a lithographic apparatus comprising a temperature conditioning system.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system PMS, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
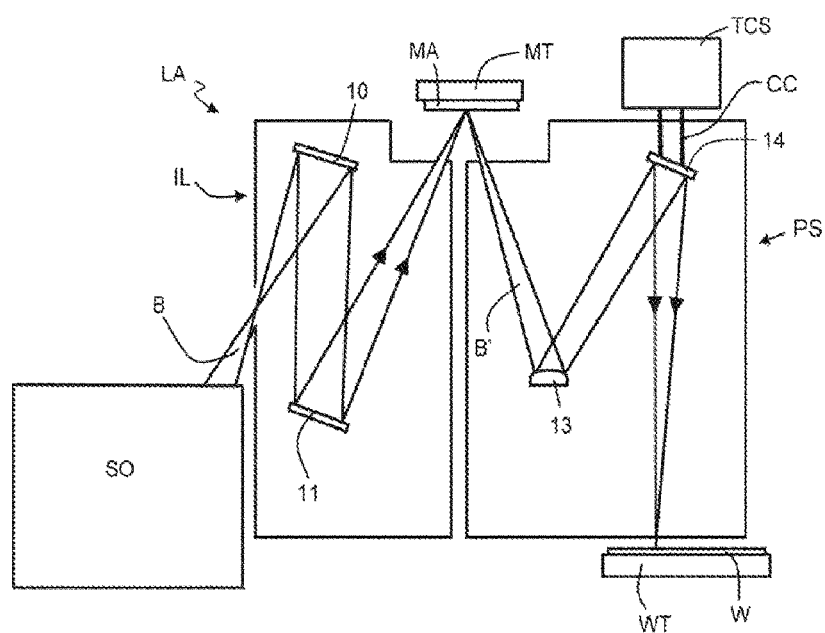
FIG. 2 depicts a schematic overview of a lithographic apparatus comprising a temperature conditioning system.

FIG. 2 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirror elements 13, 14 in FIG. 2, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

The projection system PS of the lithographic apparatus LA of FIG. 2 comprises a mirror element 14 to reflect a patterned radiation beam to guide the patterned radiation beam along a projection path. This reflection of the patterned radiation beam induces a substantial heat load on the mirror element ME. This heat load may cause thermal stresses within the mirror element ME and deformations as an effect of these thermal stresses. The deformation of the mirror element ME may have a substantial negative effect on the focus and overlay performance of the lithographic apparatus and should therefore be avoided.

To prevent or at least control the thermal stresses in the mirror element 14, a thermal conditioning system TCS is provided to condition the temperature of the mirror element 14. The thermal conditioning system TCS comprises a conditioning conduit CC that is arranged to guide a conditioning liquid, for example water. The conditioning conduit CC, that may have a plurality of tubes, runs along and/or through the mirror element 14 to facilitate heat exchange between the conditioning fluid and the mirror element 14. The thermal conditioning system TCS may be used to cool and/or to (pre-)heat the mirror element 14.

Figure 3:
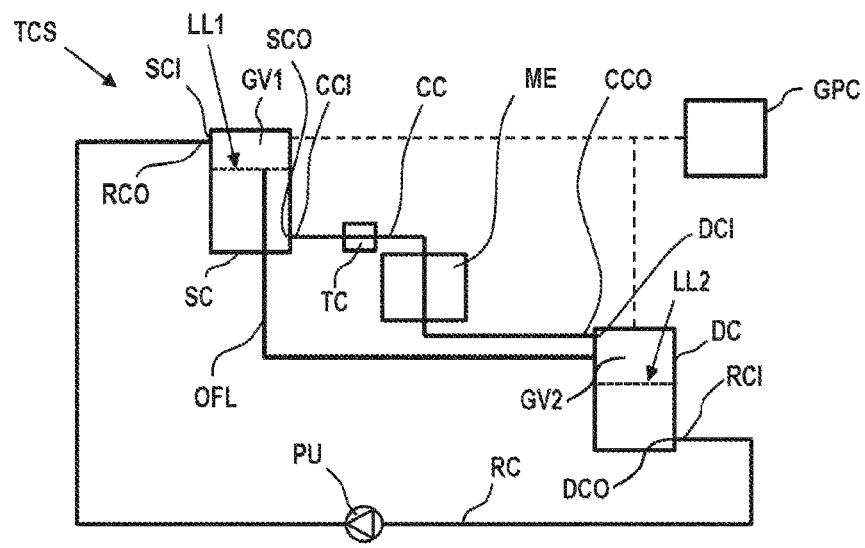
FIG. 3 depicts schematically a first embodiment of a temperature conditioning system according to the invention.

FIG. 3 shows in more detail a first embodiment of a temperature conditioning system TCS for temperature conditioning of a mirror element ME, for example mirror element 14 shown in FIG. 2. The temperature conditioning system TCS comprises a supply chamber SC and a discharge chamber DC. In the supply chamber SC conditioning liquid is held up to a first liquid level LL1. The first liquid level LL1 in the supply chamber SC is held at a constant height using an overflow line OFL, with which liquid which would be held above the first liquid level LL1 is discharged into the discharge chamber DC. In other words, any excessed liquid goes into the overflow line OFL and it is discharged into the discharge chamber DC. In the discharge chamber DC conditioning liquid is held up to a second liquid level LL2.

In the FIGS. 3 to 6 only one mirror element ME is shown. In other embodiments, the temperature conditioning system TCS is configured to temperature condition a plurality of mirror elements ME in parallel either from the same supply/discharge chambers or with separate chambers.

Along the conditioning conduit CC towards the mirror element ME, a thermal conditioner TC, for example a controlled heating element, is provided to control the temperature of the conditioning liquid flowing towards the mirror element ME. The thermal conditioner for example comprises a temperature sensor and a heating element that are arranged to maintain a constant temperature of the conditioning liquid. The thermal conditioner TC may also comprise a (controlled) cooling element. In an alternative embodiment the thermal conditioner TC may at least partly be arranged in or adjacent the supply chamber SC to control the temperature of the conditioning liquid in the supply chamber SC. In other alternative embodiments, the thermal conditioner TC may be arranged at other suitable locations, such as in a return conduit RC between pump PU and the supply chamber SC to remove heat from the liquid.

The supply chamber SC comprises a supply chamber inlet SCI and a supply chamber outlet SCO. The supply chamber inlet SCI is arranged above the first liquid level LL1 and the supply chamber outlet SCO is arranged below the first liquid level LL1. Correspondingly, the discharge chamber DC comprises a discharge chamber inlet DCI and a discharge chamber outlet DCO, wherein the discharge chamber inlet DCI is arranged above the second liquid level LL2 and the discharge chamber outlet DCO is arranged below the second liquid level LL2. Arranging the discharge chamber inlet DCI above the second liquid level LL2 advantageously eliminates the influence of the second liquid level LL2 in the conditioning liquid pressure inside the conditioning circuit CC. Therefore, having a more stable pressure advantageously reduces the transmission of FIV.

The supply chamber outlet SCO is connected to a conditioning conduit inlet CCI of the conditioning conduit CC and the discharge chamber inlet DCI is connected to a conditioning conduit outlet CCO of the conditioning conduit CC. Thus, conditioning liquid may flow from the supply chamber SC through the conditioning conduit CC to the discharge chamber DC. Since the first liquid level LL1 is held at a first height, and the discharge chamber inlet DCI is arranged at a second height, which second height is lower than the first height, there is a constant hydrostatic pressure difference between the supply chamber outlet SCO and the discharge chamber inlet DCI. This creates a continuous flow with low pressure fluctuations in the conditioning conduit CC. These flow pressure fluctuations are undesirable as these pressure fluctuations may cause flow induced vibrations of the mirror element ME that may negatively affect focus and/or overlay of the lithographic process. As the continuous flow is driven by a stable pressure difference, the present invention enables a very low the flow induced vibrations at the mirror element ME, advantageously increasing the overlay performance of the lithography apparatus LA.

As the supply chamber SC and the discharge chamber DC are arranged or placed such as there is a height difference between them, a constant hydrostatic pressure flow is provided between both chambers SC and DC and the conditioning conduit CC, creating a difference between both chambers. This advantageously reduces the FIVs transmitted to the mirror element ME. A mirror element ME without FIVs eliminates the distortions or the image errors due to the interaction of radiation beam with the mirror element ME. In one embodiment, the temperature condition system TCS may have arranged the supply chamber SC and the discharge chamber DC in a different heights relative to each other or there is a height difference between supply chamber SC and the discharge chamber DC. This creates a pressure buildup, more particularly a hydrostatic pressure buildup. Preferably the supply chamber SC is in a higher height with respect to the floor than the supply chamber SC.

A return conduit RC is provided to return the conditioning liquid from the discharge chamber DC to the supply chamber SC. The discharge chamber outlet DCO is connected to a return conduit inlet RCI of the return conduit RC and the supply chamber inlet SCI is connected to a conditioning conduit outlet CCO of the return conduit RC. In the return conduit RC, a pump PU is provided that may pump the conditioning liquid from the discharge chamber DC to the supply chamber SC. To ensure that the first liquid level LL1 in the supply chamber will remain constant, the flow rate of liquid pumped by the pump PU through the return conduit RC should always be larger than the flow rate of liquid through the conditioning conduit CC, such that there is always a liquid flow through the overflow line OFL. A first flow resistance may be provided between supply chamber SC and mirror element ME and/or a second flow resistance may be provided between mirror element ME and discharge chamber DC to control the flow given a certain vertical distance between LL1 and DCI.

The thermal conditioning system TSC may comprise a flow rate control device to control the flow rate of liquid pumped by the pump PU through the return conduit RC, wherein the control device is arranged to maintain a flow rate of liquid pumped by the pump PU which is larger than the flow rate of liquid through the conditioning conduit CC. This flow rate control device may for example actuate the pump on the basis of a sensor signal of a flow sensor that measures the flow rate of conditioning liquid within the conditioning conduit and/or within the overflow line OFL, or a sensor signal of a liquid level sensor that measures the height of the first liquid level LL1 in the supply chamber SC.

Pumping action of the pump may cause pressure fluctuations in the conditioning liquid present in the return conduit RC. To prevent that these pressure fluctuations are propagated to the conditioning liquid in the conditioning conduit CC, the pressure fluctuations are at least partially dampened by providing relatively large gas volumes in the supply chamber SC and the discharge chamber DC. To have a substantial damping effect the first gas volume GV1 in the supply chamber SC and the second gas volume GV2 in the discharge chamber each have a volume of at least 0.5 liters, for example at least 10 liters.

Damping devices or means may be provided to prevent pressure fluctuations due to accelerations of parts of the liquid system caused by machine part vibrations and/or floor vibrations. The damping devices or means may for example be located between the temperature conditioner TC and the mirror element or between the mirror element and the discharge chamber DC. The damping devices may be of a helmholz resonator type, or a bellow type damper or other types dampers, or a combination thereof.

The liquid circuit may have a number of connections to fill the circuit with primed conditioning liquid, to drain the circuit, to leaktest the circuit (i.e., to test the leaks within the circuit), and to flush and prime the circuit.

In the embodiment of FIG. 3, the conditioning conduit CC is liquidly decoupled from the return conduit. This means that there is no continuous liquid volume between the conditioning conduit CC and the return conduit RC, or at least the part of the return conduit RC where the pump is located. This has a further beneficial effect in preventing that the flow induced vibrations in the return conduit RC are propagated to the conditioning conduit CC. This liquidly decoupling is created by a first gas volume GV1 present in the supply chamber SC above the first liquid level LL1 and a second gas volume GV2 present in the discharge chamber DC above the second liquid level LL2.

Since the supply chamber inlet SCI and the discharge chamber inlet DCI are arranged above the first liquid level LL1 and the second liquid level LL2, respectively, there is no continuous liquid volume between the conditioning conduit CC and the return conduit RC. Any pressure fluctuations caused by the pump PU and propagating in the conditioning liquid present in the return conduit RC will be mainly absorbed by the first and/or second gas volumes in the supply chamber SC and the discharge chamber DC and will therefore substantially not reach the conditioning liquid in the conditioning conduit CC. The mechanical stiffness of the connections to the supply chamber SC and the discharge chamber DC are low, such that mechanical vibrations for example do not cause pressure fluctuations in the supply conduit SC and/or the conditioning conduit CC. These connections for example include connections of the return conduit RC, overflow line OFL, the conditioning conduit inlet CCI and the conditioning conduit outlet CCO.

Since the flow in the conditioning conduit is driven by the constant hydrostatic pressure difference between the pressure at the supply chamber outlet SCO and the discharge chamber inlet DCI without any pressure fluctuations caused by the pump PU, and other parts/components, the flow of conditioning liquid through the conditioning conduit has very low flow induced vibrations. It is possible that the supply chamber inlet SCI and/or discharge chamber inlet DCI are not arranged above the first liquid level LL1 and the second liquid level LL2, respectively. In such embodiment, the flow induced vibrations present in the return conduit RC may be blocked before reaching the conditioning conduit CC by providing one or more valves, as described with respect to the embodiment of FIG. 6, or damping material or dampening device, such as foam, mesh and/or perforated materials may be provided to damp the propagation of pressure fluctuations through the conditioning liquid. In such embodiment the relative large volumes of the first gas volume GV1 and the second gas volume GV2 also have the effect of dampening the flow induced vibrations. The temperature conditioning system TCS of FIG. 3 is a closed system. This means that there is no direct fluid connection to the environment. The pressure in the first gas volume GV1 in the supply chamber SC and the second gas volume GV2 in the discharge chamber DC is controlled by a gas pressure controller GPC. The pressure in both the first volume GV1 and the second gas volume GV2 is the same. The flow though the conditioning conduit CC is therefore only driven by the constant hydrostatic pressure difference between the pressure at the supply chamber outlet SCO and the discharge chamber inlet DCI caused by the height difference between the first liquid level LL1 and the height of the discharge chamber inlet DCI. In a further embodiment, a pressure sensor PSE may be provided to measure a pressure in the conditioning conduit CC. The measured pressure can be used as input for the gas pressure controller GPC.

The gas pressure controller GPC is used to maintain a constant sub-atmospheric pressure in the first gas volume GV1 and the second gas volume GV2. In one embodiment, a first pressure inside the supply chamber SC and a second pressure inside the discharge chamber DC are held at sub-atmospheric pressure. The pressure in the first gas volume GV1 and the second gas volume GV2 is for example set at an absolute pressure level below 0.5 bar, for instance in the range of 0.1 bar to 0.3 bar. Advantageously, a sub-atmospheric thermal conditioning system reduces the deformations on the surface of the mirror element ME. Additionally, having a conditioning fluid flowing in a sub atmospheric pressure throw the mirror element ME advantageously reduces the stiffness of the mirror element dynamic link, which in turn helps to achieve a dynamic decoupling of the vibrations.

In one embodiment the thermal conditioning system TCS comprises a gas pressure controller configured to control a gas pressure level in at least one of the chambers, i.e., only the supply chamber, only the discharge chamber or both. As it is said above, the first pressure in the supply chamber and the second pressure in the discharge chamber are held at a sub-atmospheric pressure level.

Figure 4:
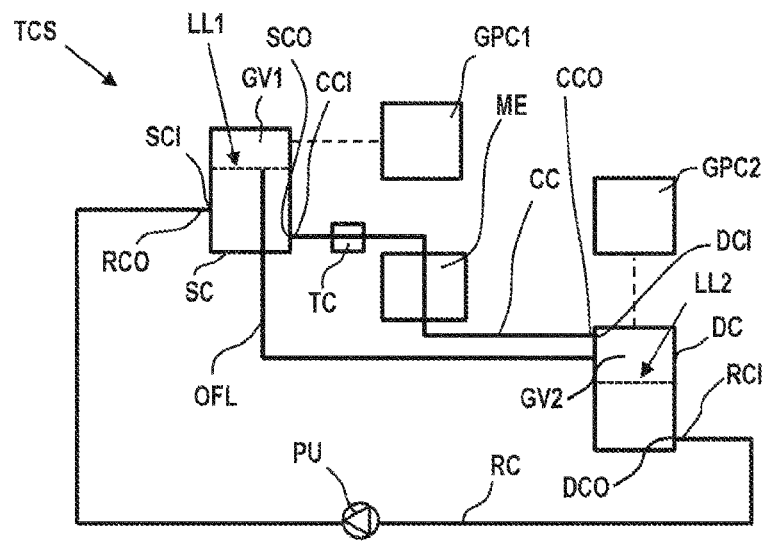
FIG. 4 depicts schematically a second embodiment of a temperature conditioning system according to the invention.

FIG. 4 shows a second embodiment of a thermal conditioning system TCS. This embodiment differs from the embodiment of FIG. 3 in how the gas pressure in the supply chamber SC and the discharge chamber DC is controlled. Where the embodiment of FIG. 3 comprises one gas pressure controller GPC to maintain a constant sub-atmospheric pressure in the first gas volume GV1 and the second gas volume GV2, the embodiment of FIG. 4 comprises a first gas pressure controller GPC1 to control the gas pressure in the first gas volume GV1 in the supply chamber SC and a second gas pressure controller GPC2 to control the gas pressure in the second gas volume GV2 in the discharge chamber SC. In a further embodiment, a pressure sensor PSE may be provided to measure a pressure in the conditioning conduit CC. The measured pressure can be used as input for first gas pressure controller GPC1 and the second gas pressure controller GPC2.

The advantage of two separate gas pressure controllers GPC1, GPC2, is that the static pressure difference between the supply chamber outlet SCO and the discharge chamber inlet DCI is not only determined by the height difference between the first liquid level LL1 and the height of the discharge chamber inlet DCI, but also by the pressure difference between the pressure in the first gas volume GV1 and the pressure in the second gas volume GV2. Since the gas pressures provided by the first gas pressure controller GPC1 and the second gas pressure controller GPC2 can be accurately and actively controlled, this set-up provides more flexibility with respect to the relative placement of the supply chamber SC and the discharge chamber DC in vertical direction. In the embodiment of FIG. 3, there is a required height difference between the supply chamber SC and the discharge chamber DC as the flow through the conditioning conduit CC is only driven by hydrostatic pressure difference caused by height difference as shown in the embodiment of FIG. 3. In the embodiment of FIG. 4, the requirements on height difference are less strict as the pressure difference provided by the gas pressure controllers GPC1, GPC2 provide additional possibilities to control the flow through the conditioning conduit CC.

In the embodiment of FIG. 4, the discharge chamber inlet DCI is arranged below the first liquid level LL1. In this embodiment, the relative large volume of the first gas volume GV1 reduces the propagation of flow induced vibrations coming from the return condition RC into the conditioning conduit CC. In addition, the supply chamber inlet SCI comprise a mesh/foam to damp the propagation of pressure fluctuations through the conditioning liquid. The conditioning liquid will flow through the mesh reducing/damping the vibrations when flowing into the supply chamber SC and discharge chamber DC, respectively. An example of an embodiment of such discharge chamber DC and supply chamber SC can be found in FIGS. 7 to 9.

In the embodiment of FIG. 4, the flow through the conditioning conduit CC is based on a static pressure difference which results in a flow with low pressure fluctuations through the conditioning conduit CC. This advantageously enables a flow with an extremely low flow induced vibrations because the flow is driven by a stable pressure difference. The first gas pressure controller GPC1 and the second gas pressure controller GPC2 are also used to maintain a sub-atmospheric pressure in the first gas volume GV1 and the second gas volume GV2. Therewith the presence of flow induced vibrations in the mirror element ME by the flow of conditioning fluid may be further reduced.

Figure 5:
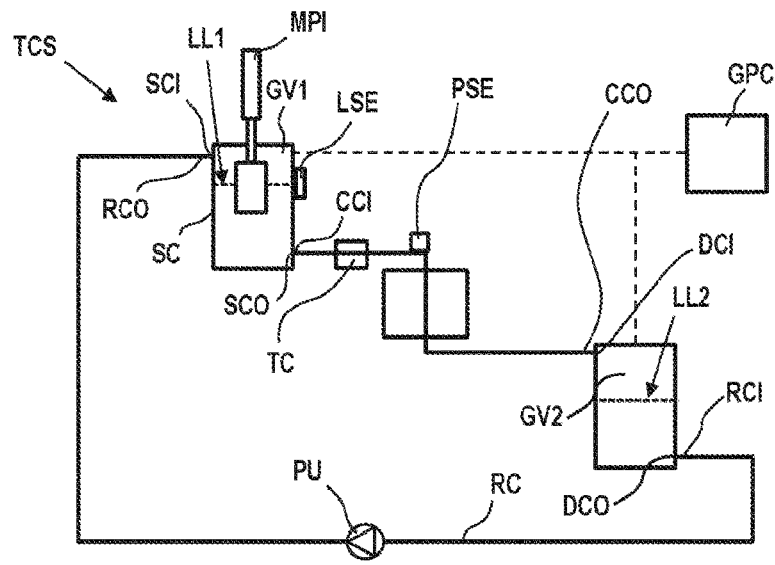
FIG. 5 depicts schematically a third embodiment of a temperature conditioning system according to the invention.

FIG. 5 shows a third embodiment of a thermal conditioning system TCS. This embodiment differs from the embodiment of FIG. 3 in the way the first liquid level LL1 is controlled. In this embodiment, a movable piston MPI is provided which comprises a piston body which is partially submerged into the liquid in the supply chamber SC, and a linear actuator which is configured to move the piston body in vertical direction to actively adapt a depth with which the piston body is submerged into the liquid.

A liquid level sensor LSE is provided to measure the first liquid level LL1 of liquid in the supply chamber SC. On the basis of the first liquid level LL1 as measured by the liquid level sensor LSE the position of the piston body may be adapted to control the first liquid level LL1. In this way, a constant hydrostatic pressure difference between the supply chamber outlet SCO and discharge chamber inlet DCI can be maintained to drive a constant flow through the conditioning conduit CC.

In addition, or as an alternative, a pressure sensor PSE can be provided to measure a pressure in the conditioning conduit CC, and the movable piston MPI is actively controlled to maintain a constant pressure at the location of the pressure sensor PSE, i.e. the location where the pressure in the conditioning conduit CC is measured.

Using this active control of the first liquid level LL1 on the basis of the measured height of the first liquid level LL1 and/or the pressure at a measurement location in the conditioning conduit CC, variations in the pressure build-up in the thermal conditioning system TCS may be more accurately handled. For example, a temporarily shortage of influx of conditioning liquid can be balanced by moving the piston MPI downwards thus maintaining the desired first liquid level LL1. This prevents that pump flow variations of the pump PU will cause level fluctuations of the first liquid level LL1, which in turn causes deviations from the desired pressure level in the conditioning conduit CC and variations in flow rate in the conditioning conduit CC.

Similar to the embodiment of FIG. 3, the conditioning conduit CC is liquidly decoupled from the return conduit RC by the first gas volume GV1 in the supply chamber SC and the second gas volume GV2 in the discharge chamber DC. Since the supply chamber inlet SCI and the discharge chamber inlet DCI are arranged above the first liquid level LL1 and the second liquid level LL2, respectively, there is no continuous liquid volume between the conditioning conduit CC and the return conduit RC that may propagate pressure fluctuations caused by the pumping action of the pump PU. Alternatively, or in addition, constructions/materials that dampen pressure fluctuations may be provided.

Figure 6:
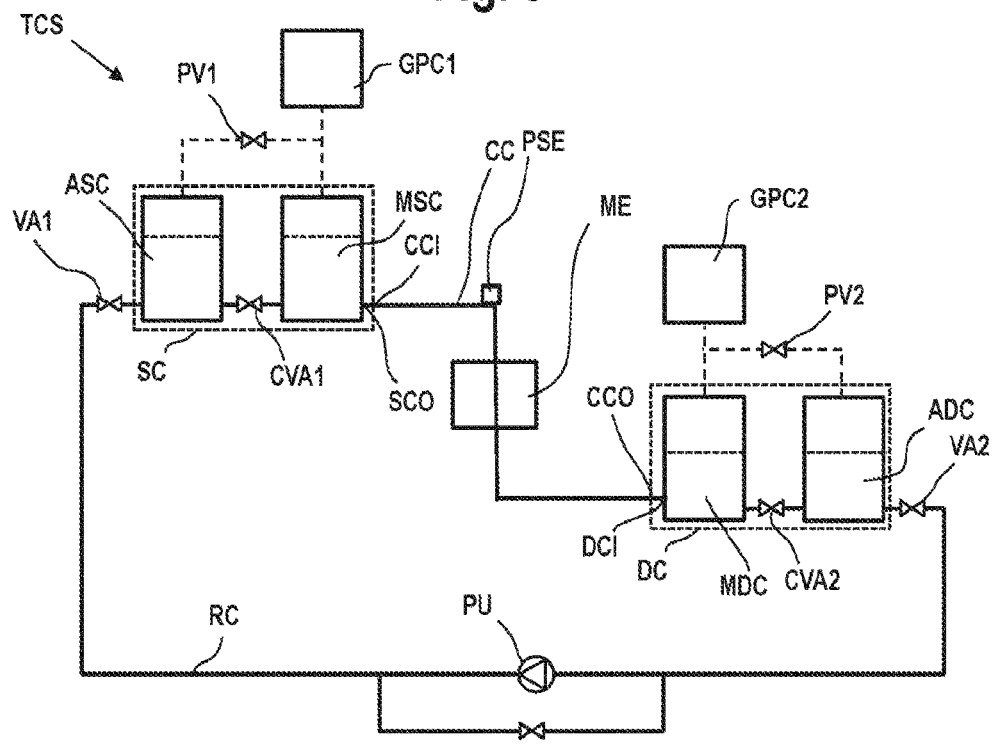
FIG. 6 depicts schematically a fourth embodiment of a temperature conditioning system according to the invention.

FIG. 6 shows a fourth embodiment of a thermal conditioning system TCS. In this embodiment, the supply chamber SC comprises a main supply chamber MSC and an auxiliary supply chamber ASC connected to each other via a first connection conduit comprising a first connection valve CVA1. The discharge chamber DC comprises a main discharge chamber MDC and an auxiliary discharge chamber ADC connected to each other via a second connection conduit comprising a second connection valve CVA2. Further, the return conduit RC comprises a first valve VA1 downstream of the pump PU and a second valve VA2 upstream of the pump PU. Each of the first and second connection valves CVA1, CVA2 and the first and second valves VA1, VA2 can be arranged in a closed position and an open position.

The thermal conditioning system TCS also comprises a first gas pressure controller GPC1 to control the gas pressure in the main supply chamber MSC and the auxiliary supply chamber ASC and a second gas pressure controller GPC2 to control the gas pressure in the main discharge chamber MDC and the auxiliary discharge chamber ADC. A first pressure valve PV1 and a second pressure valve PV2 are provided to open and/or close the pressure control of the auxiliary supply chamber ASC and the auxiliary discharge chamber ADC, respectively.

Liquid levels in the main supply chamber MSC and the main discharge chamber MDC may vary over time. In a particular embodiment not shown in the figures, a first liquid level sensor LLSS may be provided in the main supply chamber MSC to measure the liquid level in the main supply chamber MSC. Correspondingly, a second liquid level sensor LLSD may be provided in the main discharge chamber MDC to measure the liquid level in the main discharge chamber MDC. The liquid levels as measured by the first liquid level sensor LLSS and the second liquid level sensor LLSD can be used as an input for the first gas pressure controller GPC1 and the second gas pressure controller GPC2, respectively to adjust the pressure level in dependence of the actual liquid levels in the main supply chamber MSC and the main discharge chamber MDC.

The configuration of FIG. 6 allows two (main) modes of operation. In a first mode, the first valve VA1 and the second valve VA2 are closed, while the first connection valve CVA1 and the second connection valve CVA2 and the first pressure valve PV1 and the second pressure valve PV2 are opened.

In this first mode, the main supply chamber MSC and the auxiliary supply chamber act as a single supply chamber SC and the main discharge chamber MDC and the auxiliary discharge chamber ADC act as a single discharge chamber DC. By controlling the pressure in the supply chamber SC and the discharge chamber DC using the first gas pressure controller GPC1 and the second gas pressure controller GPC2, respectively, the static pressure difference between the supply chamber outlet SCO and the discharge chamber inlet DCI can be accurately controlled to create a constant flow with low pressure fluctuations through the conditioning conduit CC.

This control can for example be further improved by using a measured pressure level as measured by the pressure sensor PSE in the conditioning conduit CC. In this first mode of operation, the return conduit RC is at least partially liquidly decoupled from the conditioning conduit by the closed first valve VA1 and the closed second valve VA2. Conditioning liquid flows from the supply chamber SC to the discharge chamber DC, but no conditioning liquid can flow back from the discharge chamber DC to the supply chamber SC since the first valve VA1 and the second valve VA2 are closed.

In the second mode of operation, the first valve VA1 and the second valve VA2 are opened, while the first connection valve CVA1 and the second connection valve CVA2 and the first pressure valve PV1 and the second pressure valve PV2 are closed. In this second mode, only the main supply chamber MSC acts as supply chamber SC and the main discharge chamber MDC acts as discharge chamber DC. By controlling the pressure in the main supply chamber SC and the main discharge chamber MDC using the first gas pressure controller GPC1 and the second gas pressure controller GPC2, respectively, the static pressure difference between the supply chamber outlet SCO and the discharge chamber inlet DCI can be accurately controlled to create the constant flow with low pressure fluctuations through the conditioning conduit CC in order to prevent flow induced vibrations in the mirror element.

In the second mode of operation, the conditioning liquid from the auxiliary discharge chamber ADC can be pumped by the pump PU through the return conduit RC to the auxiliary supply chamber ASC to refill the auxiliary supply chamber ASC. In this second mode of operation, the main supply chamber MSC is liquidly decoupled from the part of the return conduit RC where the pump PU is arranged by the closed first connection valve CVA1 and the main discharge chamber MDC is liquidly decoupled from the part of the return conduit RC, where the pump PU is located by the closed second connection valve CVA2. In this way, the conditioning conduit CC is liquidly decoupled from the return conduit RC in the second mode of operation, while at the same time conditioning liquid is pumped back to the auxiliary supply chamber ASC.

By alternating the first mode of operation and the second mode of operation, a constant flow based on a static pressure difference between the supply chamber outlet SCO and the discharge chamber inlet DSI can be created, while at the same time at least the part of the return conduit RC where the pump is located is liquidly decoupled from the conditioning conduit CC. This has the advantage that flow induced vibrations of the mirror element ME caused by pressure fluctuations in the conditioning liquid, for example as a result of the pumping action of the pump PU are substantially reduced.

In the embodiments of the thermal conditioning system TCS, described above, it is beneficial that the flow of conditioning liquid into and out of the supply chamber SC and the discharge chamber DC is without creating pressure fluctuations that may propagate through the conditioning liquid, in particular in the conditioning conduit CC.

For example, at the location of the supply chamber outlet SCO, the conditioning liquid enters from a large volume in the supply chamber SC into a small diameter tube of the conditioning conduit CC such that the flow will accelerate. Without provisions, the flow might tend to separate at the conditioning conduit inlet CCI, which may cause flow induced vibrations in the mirror element ME. To prevent this, for example, a curved inlet with a flow straightener may be placed at the supply chamber outlet SCO placed.

At the locations of inflow of water into the supply chamber and/or discharge chamber, the conditioning liquid may flow into the respective chamber above the respective liquid level. To reduce/prevent the effect of pressure fluctuations, controlled inflow of conditioning liquid into the chamber may be created by providing specific constructions or materials that break up the flow of conditioning liquid and allow the conditioning liquid to enter the volume of conditioning fluid in the chamber smoothly. For example, conditioning liquid may enter the chamber at the top and fall on a wire mesh, arranged inside a perforated tube. The wire mesh may break up the water column and the perforated tube allows the conditioning fluid to enter the volume of conditioning fluid in the respective chamber smoothly.

Figure 7:
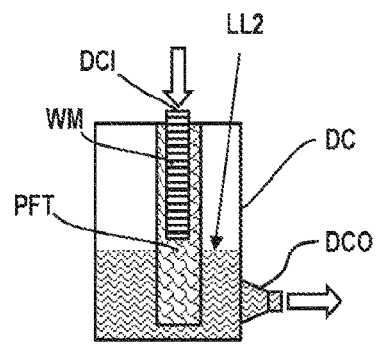
FIG. 7 depicts schematically an exemplary embodiment of a discharge chamber.

FIG. 7 shows an exemplary embodiment of a discharge chamber DC in more detail. From pressure level control point of view, it is desired that the conditioning liquid entering the discharge chamber DC through discharge chamber inlet DCI is disconnected from the second liquid level LL2 to prevent that changes in the second liquid level LL2 result in pressure level changes, which results in a flow and pressure level change back into the conditioning conduit CC. The disconnection of the conditioning liquid flowing through the discharge chamber inlet DCI and the conditioning liquid already present in the discharge chamber DC is realized by placing the discharge chamber inlet DCI in the top wall of the discharge chamber DC. To further reduce/prevent pressure fluctuations caused by conditioning liquid falling onto the second liquid level LL2 a wire mesh WM inside a perforated tube PFT is provided. The wire mesh WM breaks up the conditioning liquid column falling down through the discharge chamber inlet DCI and the perforated tube PT makes sure that the conditioning liquid will enter the volume of conditioning liquid in the discharge chamber smoothly. The wire mesh WM may be an example of an inlet flow dampening device.

In an alternative embodiment, a stair or staired shape, i.e., or broad stairs of which the conditioning liquid may flow into the chamber with low velocity and small height step before it touches the liquid level may be applied. The stairs or staired shape may be an example of an inlet flow dampening device.

Figure 8:
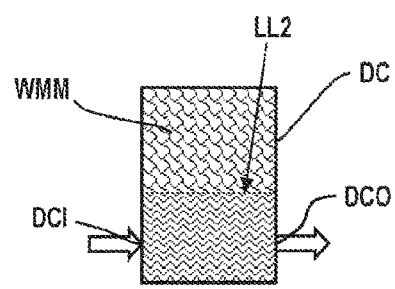
FIG. 8 depicts schematically an alternative exemplary embodiment of a discharge chamber.

Another alternative embodiment provides a slit or a small slit as water inlet through which the water flows into the chamber. This slit might take the form of a planar slit or a circular slit. In yet another embodiment, as shown in FIG. 8, the inner wall of the chamber may be coated with a wire-mesh material WMM behind a perforated plate to smoothen the entrance of conditioning liquid into the chamber. The slit or small slit may be an example of an inlet flow dampening device.

Also in embodiments, in which the conditioning fluid may enter a chamber below the liquid level damping materials, such as porous, foam, mesh and/or perforated material may be provided to dampen pressure fluctuations in the conditioning fluid. These embodiments and the wire mesh WM described in the embodiments of FIGS. 7 and 8 may be also applicable to a supply chamber SC. Therefore, a supply chamber SC may comprise the wire mesh WM, damping materials, stairs and/or the slit above described. All those elements may be an example of an inlet flow dampening device.

Figure 9:
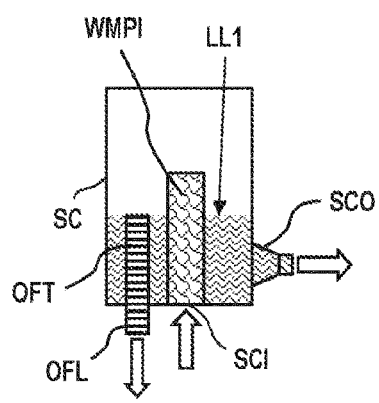
FIG. 9 depicts schematically an exemplary embodiment of a supply chamber.

FIG. 9 shows an exemplary embodiment of a supply chamber SC. The supply chamber inlet DCI is aligned with a wire-mesh and perforated inlet WMPI to reduce the liquid velocity to near zero m/s before it enters the supply chamber SC to prevent pressure fluctuations in the supply chamber. The overflow line OFL comprises an overflow tube OFT extending to the first liquid level LL1 to maintain the first liquid level LL1 at a constant height. To maintain the first liquid level LL1 at a constant height, i.e. stable within less than 0.2 mm, the overflow tube OFT is made hydrophobic to prevent that the fluid surface tension creates a meniscus that negatively influences the desired height of the first liquid level LL1. The gas volume above the first liquid level LL1 in relation to the water level variation is an important parameter in the damping of pressure fluctuations due to water level variations. Therefore, the volume of the gas in the supply chamber is at least 0.5 liters, for example at least 10 liters.

More generally, it may be desirable to provide suitable materials at locations in the conditioning liquid circuit of the temperature conditioning system where a discontinuity, such as for example a bend, a constriction or a manifold, in the flow path is present that may cause flow induced vibrations in the conditioning liquid circuit. These materials may for example include foam material, porous material, mesh material, perforated materials, and (other) materials with large damping characteristics, for example PUR. Also, multiple substantially parallel channels may be provided to reduce flow disturbances in the flow of conditioning liquid.

The main working principle is based on making the flow uniform in combination with the increased dominance of viscous forces relative to the inertial forces. Due to porous, foam or similar materials the flow in a conduit may be locally obstructed and the larger flow structures/turbulent eddies are broken up into smaller structures/eddies such that a more uniform flow distribution is obtained. Further, the local viscous forces are increased due to the high shear stresses in the porous or similar material resulting into a distributed high pressure loss. Also, by enabling a porous or similar material the effective Reynolds number is reduced which further contributes to the increased dominance of viscous forces relative to the inertial forces. As a result, the redirection of the flow momentum is relaxed due to the more uniform flow distribution and locally increased dominance of viscous forces relative to the inertial forces balancing the pressure gradients associated with bending the flow. As a result, the flow is guided more smoothly through channels with discontinuities in the flow path leading to reduced effects of flow separation and induced flow induced vibrations.

In a particular embodiment, a metal foam material could be applied. Such metal foam can be made by sintering, additive manufacturing, or other known techniques to create metal foam structures such as powder metallurgy process techniques, metallurgic melting process techniques, etc.

Multiple parallel channels may for example be formed by a metal part with many small laser-cut channels, a bundle of fibers/microfibers/nanofiber tubes packed in a part, or by additive manufacturing.

Figure 10:
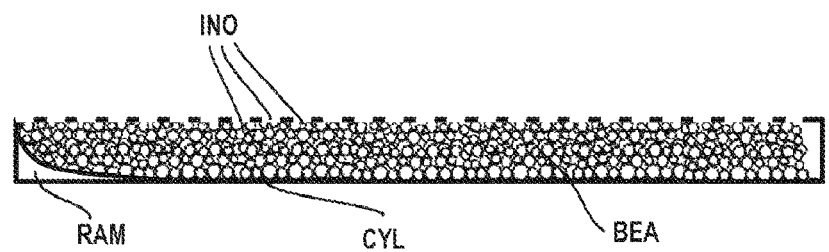
FIG. 10 depicts schematically an exemplary embodiment of a porous channel.

FIG. 10 shows a first exemplary embodiment of a tube in which elements are provided to create a partly filled channel. This embodiment comprises an Ultra Low Expansion Glass (ULE) cylinder CYL filled with sintered ULE beads BEA to avoid differential thermal expansion. At the top side multiple inlet openings INO are provided for inflow of conditioning liquid. During manufacturing, a sacrificial material can be mixed with the beads BEA, to be removed by a solvent or heating to increase the percentage of voids. The primary material choice of the cylinder is ULE to minimize the thermal expansion of the material to prevent stresses that might be introduced to the mirror. If such stresses can be allowed, an alternative material can be considered. Additionally, or alternatively, other colloidal particle shapes can be considered to infiltrate the cylinder, such as fibers, microfibers, nanofibers, fiber bundles or polygonal shapes. At one end of the cylinder CYL a ramp of ULE may be provided to guide the flow of liquid through the cylinder CYL. The construction shown in FIG. 9 may for example be used as a manifold in a thermal conditioning system.

Figure 11A:
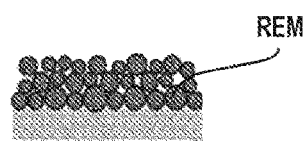
FIGS. 11A-11C depicts schematically an embodiment of a production method of a porous channel
Figure 11B:
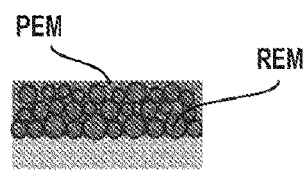
Figure 11C:
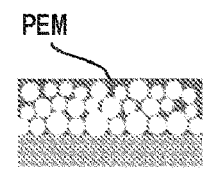

FIGS. 11A-11C show an alternative process to create an inverted, more open structure. In FIG. 11A, it is shown that a template is made with removable elements REM that for example can be removed by a solvent or heating. In FIG. 11B, it shown that the space not occupied by the removable elements is infiltrated by a permanent material PEM. In the final step, the removable elements are removed. This will result in the porous structure shown in FIG. 11C.

Other techniques to make suitable damping materials may also be applied. For example, flexible viscoelastic hosing may be applied to provide damping.

Hereinabove, a thermal conditioning system is disclosed for thermal conditioning of a mirror element of a projection system of a lithographic apparatus. The thermal conditioning system may also be applied for temperature conditioning of other objects of a lithographic apparatus or other devices, in which flow induced vibrations in the object caused by flow of conditioning fluid should be reduced.

In the embodiments of FIGS. 3-5, the liquid level LL1 of the supply chamber SC needs to be controlled to a precise level, for example within a height range of 0.2 mm to meet pressure stability requirements in the conditioning conduit CC that runs through or along the mirror element ME. Based on the gravitational pressure buildup $\Delta p = \rho g \Delta h$, a 0.2 mm variation in the first liquid level LL1 results into a pressure variation of 2 Pa.

In the embodiments of FIGS. 3 and 4, the overflow line OFL is used to keep a stabile first liquid level LL1 in the supply chamber SC and therewith keep the supply pressure to the mirror element ME stable within the desired pressure range.

However, in the overflow channel OFL a two phase flow may arise because gas present in the supply chamber SC above the first liquid level LL1 may be drawn by the liquid into the overflow line OFL and may mix with the liquid towards the discharge chamber DC. Such gas-liquid mixture may cause pressure fluctuations that are propagated to the supply chamber SC and the discharge chamber DC. These pressure fluctuations may cause displacements of the mirror element ME and deformations of the mirror element ME leading to overlay errors, fading and flare, and are therefore undesirable.

Moreover, in the embodiment of FIG. 4, an additional pressure difference between the supply chamber SC and the discharge chamber DC may be created by separate control of the pressure of the first gas volume GV1 and the pressure in the second gas volume GV2 using the first a first gas pressure controller GPC1 and the second gas pressure controller GPC2, respectively. This additional pressure difference may also induce a gas flow from the supply chamber SC to the discharge chamber DC. Also this gas flow may create a two phase flow that may lead to pressure fluctuations and as a result the associated negative effects of overlay errors, fading and flare. The presence of gas in the flow through the overflow line OFL may also have an impact on the set pressure difference between supply chamber SC and discharge chamber DC. It is therefore desirable that the presence of gas in the flow through the overflow line OFL is substantially reduced.

Figure 12:
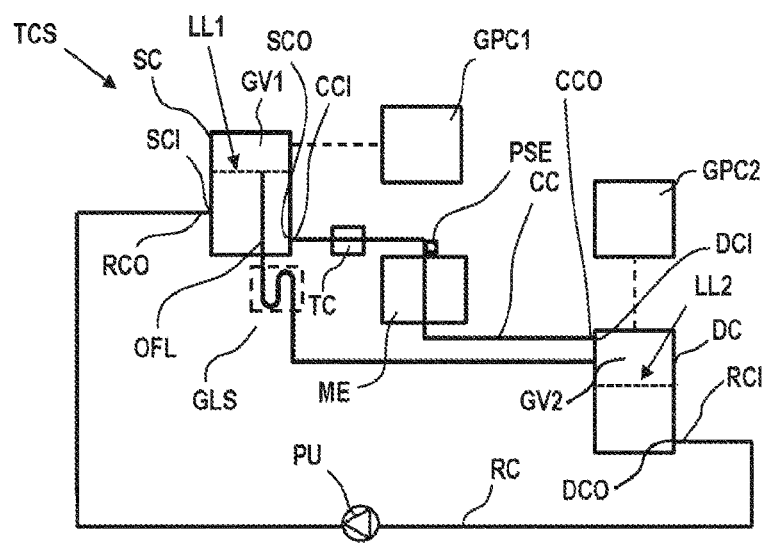
FIG. 12 depicts an embodiment of the temperature conditioning system of FIG. 4 with a first embodiment of a gas liquid separator in the overflow line.

FIG. 12 shows the thermal conditioning system of FIG. 4, wherein a gas liquid separator GLS is provided in the overflow line OFL to prevent a gas flow through the overflow line OFL due to a gas pressure difference between the supply chamber SC and the discharge chamber DC. The gas liquid separator GLS is formed by a liquid trap, i.e. an inverted syphon, shown in more detail in FIG. 13.

The gas liquid separator GLS is a part of the overflow line OFL. The liquid enters the gas liquid separator GLS at OFL-I and leaves the gas liquid separator GLS at OFL-O. In the gas liquid separator GLS at least one, in flow direction, upwardly running channel part URC is provided to create a liquid trap that allows the gas to flow back to the inlet of the gas liquid separator GLS at OFL-I instead of flowing further as a two phase flow through the overflow line. In the upwardly running channel part URC porous material POM is arranged. The porous material POM may provide damping to prevent or reduce pressure fluctuations in the flow due to the inflow or sloshing of the liquid flow. The porous material POM comprises for example balls, mesh, and/or perforated elements.

The gas liquid separator GLS is arranged to block, at least partially, the gas entrained with the liquid flow to flow further along the overflow line OFL towards the discharge chamber DC. The gas entrained in the liquid flow flowing into the overflow line OFL will be separated from the liquid flow and may flow back through the overflow line OFL to the supply chamber SC. Therewith, the two phase flow in the overflow line OFL is effectively stopped, or at least substantially reduced, at the gas liquid separator GLS.

Due to the additional pressure difference that may be created in the embodiment of FIG. 4, the liquid level in the upwardly running channel part URC is higher than the liquid level in the channel part coming from the supply chamber (the left channel). The height of the upwardly running channel part URC is selected to accommodate this additional pressure difference.

The gas liquid separator GLS is arranged, at least in vertical direction, relatively close to the supply chamber SC. For example, when the height difference between the first liquid level LL1 and the discharge chamber inlet DCI of the discharge chamber is H, the gas liquid separator GLS may be arranged, in vertical direction, at a distance of maximally 0.2H, for example maximally 0.1H from the supply chamber SC. In that case, there is a relatively small length of the overflow line OFL in which the two phase flow occurs, i.e. between supply chamber SC and gas liquid separator GLS. The distance between the supply chamber SC and the gas liquid separator may for example be less than 1 m.

The gas liquid separator inlet at OFL-I and gas liquid separator outlet at OFL-O are designed such that the interaction of water and gas does not cause, or at least reduces a film formation/collapsing process as this may cause pressure fluctuations. For example, a high wettability material and/or coating may arranged at the inlet OFL-I and outlet OFL-O. For example, a metallic material may be provided at the inlet OFL-I and outlet OFL-O. Furthermore, the geometry of the inlet/outlet may be optimized by enabling a conical or funnel like design with a sufficiently large diameter to allow a smooth inflow of water into the gas liquid separator.

The gas liquid separator GLS may be made of any suitable material, for example metal, such as stainless steel, or plastics material, such as polyurethane.

Figure 14:
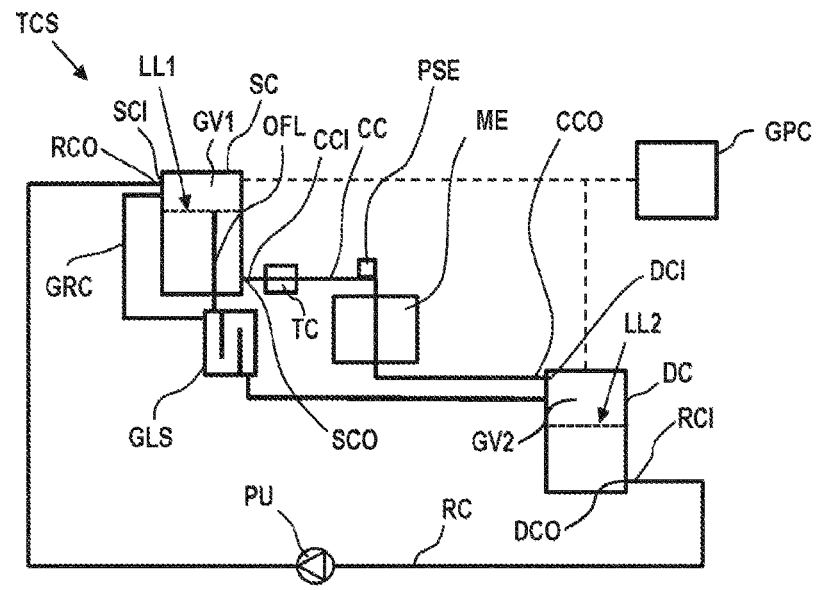
FIG. 14 depicts an embodiment of the temperature conditioning system of FIG. 3 with a second embodiment of a gas liquid separator in the overflow line.

FIG. 14 shows the embodiment of FIG. 3 in which an alternative embodiment of a gas liquid separator GLS is provided to separate gas entrained with the liquid flow into the overflow line OFL. The gas liquid separator GLS of FIG. 14 is shown in more detail in FIG. 15.

Figure 15:
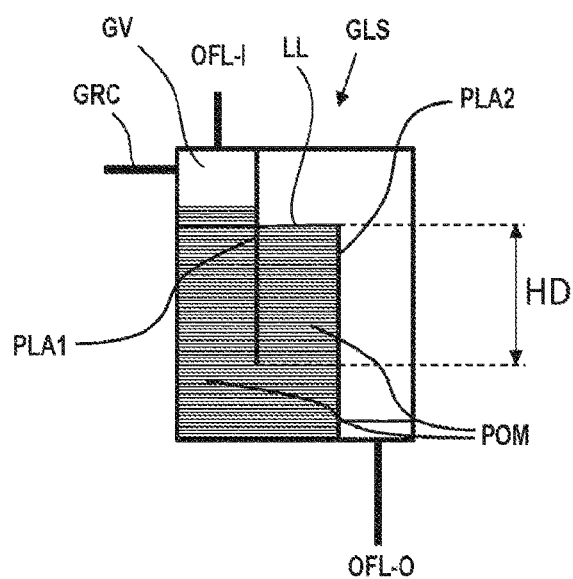
FIG. 15 depicts the gas liquid separator of FIG. 14 in more detail.

The gas liquid separator GLS is formed as a closed box in which a first plate PLA1 defining a lower opening inside the gas liquid separator GLS and a second plate PLA2 defining an upper opening inside the gas liquid separator GLS are provided to form a liquid trap construction, as it is depicted in FIG. 15. A liquid level LL of the liquid in the liquid trap construction is at the same height as the upper end of the second plate PLA2.

Close to the inlet OFL-I of the gas liquid separator GLS a gas return channel GRC is provided to allow gas that is separated from the liquid flow to flow back to the supply chamber SC through another channel than the overflow line OFL. Such separate gas return channel GRC may further reduce the occurrence of pressure fluctuations caused by the presence of gas in the overflow line. To effectively use the gas return channel GRC, the gas liquid separator GLS is designed to have a gas volume GV that directly connects to the gas return channel GRC so that gas that is separated from the liquid will be able to enter the gas return channel GRC via the gas volume GV.

The position of the gas return channel GRC inlet in the supply camber SC should be carefully selected. It should fulfil the following conditions: it should be above the liquid level LL1 to prevent that the gas creates bubbles which pop at the surface, generating vibrations or acoustic disturbances. Additionally, the gas coming from gas return channel GRC should not interfere with the return flow coming from the supply chamber inlet SCI to prevent vibrations or acoustic disturbances. Also, the gas return channel GRC should be in fluid communication to with the first gas volume GV1 to dampen pressure fluctuations. In the embodiment of FIG. 14, the gas return channel GRC inlet in the supply camber SC is located below the supply chamber inlet SCI in such a way that said conditions are fulfilled. In other embodiments, the gas return channel GRC inlet may be located above the supply chamber inlet SCI, or in the top surface of the supply chamber SC and also fulfilling said conditions.

Porous material POM is arranged in the gas liquid separator GLS to create damping to the liquid flow in order to prevent pressure fluctuations due to inflow and sloshing. The porous material POM comprises for example balls, mesh, and/or perforated elements. The porous material for example is at least present up to the liquid level LL in the liquid trap construction to dampen pressure fluctuations in the liquid present in the liquid trap construction. When desired, for example due to the way of manufacturing more porous material may be provided in the gas liquid separator GLS. For instance, the porous material may be introduced from the top side of the box, before closing, over the complete bottom area of the box until a desired level of porous material in the box is reached.

Figure 13:
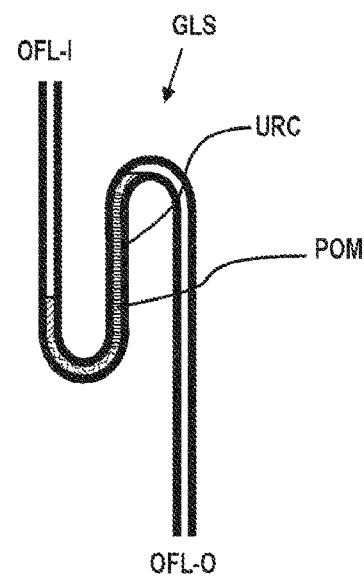
FIG. 13 depicts the gas liquid separator of FIG. 12 in more detail.

Correspondingly to the embodiment of FIGS. 12 and 13, the gas liquid separator GLS is arranged to block, at least partially, the gas entrained with the liquid flow to flow further along the overflow line OFL towards the discharge chamber DC. The gas entrained in the liquid flow flowing into the overflow line OFL will separate from the liquid flow and move upwardly towards the gas volume GV from where the gas may flow through the gas return channel back to the supply chamber SC.

It may be advantageous to arrange the gas liquid separator GLS, at least in vertical direction, relatively close to the supply chamber SC as explained with respect to the embodiment of FIGS. 12 and 13.

The gas liquid separator GLS may be made of any suitable material, for example metal, such as stainless steel, or plastics material, such as polyurethane.

The gas liquid separator GLS of FIG. 15 may also be combined with the embodiment of the thermal conditioning system of FIG. 4. In that case, an additional pressure difference between the supply chamber SC and the discharge chamber DC may be created by separate control of the pressure of the first gas volume GV1 and the pressure in the second gas volume GV2 using the first a first gas pressure controller GPC1 and the second gas pressure controller GPC2, respectively. To accommodate such additional pressure difference the vertical height HD between the lower end of the first plate PLA1 and the upper end of the second plate PLA2 should be selected accordingly. In practice, this length may be at least 30 cm, for example at least 50 cm.

The gas liquid separator GLS of FIG. 13 may also be combined with the embodiment of the thermal conditioning system of FIG. 3.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the clauses set out below.

1. A temperature conditioning system using conditioning liquid to condition a temperature of an object, comprising:
   a conditioning conduit to guide conditioning liquid through or along the object, the conditioning conduit comprising a conditioning conduit inlet and a conditioning conduit outlet,
   a return conduit having a return conduit inlet and a return conduit outlet,
   a supply chamber having a supply chamber inlet connected to the return conduit outlet and a supply chamber outlet connected to the conditioning conduit inlet, and
   a discharge chamber having a discharge chamber inlet connected to the conditioning conduit outlet and a discharge chamber outlet connected to the return conduit inlet,
   wherein the temperature conditioning system is arranged to provide a static pressure difference between the supply chamber outlet and the discharge chamber inlet to create a flow through the conditioning conduit.
2. The temperature conditioning system of clause 1, wherein the return conduit comprises a pump configured to pump conditioning liquid from the discharge chamber to the supply chamber, and wherein the temperature conditioning system is arranged to dampen propagation of flow induced vibrations caused by the pump into the conditioning conduit.
3. The temperature conditioning system of clauses 1 or 2, wherein the supply chamber comprises a first gas volume and the discharge chamber comprises a second gas volume, wherein the first gas volume and the second gas volume have a volume of at least one 0.5 liters.
4. The temperature conditioning system of clause 2 or 3, wherein a first pressure in the supply chamber and a second pressure in the discharge chamber are held at a sub-atmospheric pressure level.
5. The temperature conditioning system of any of the clauses 2-4, wherein the temperature conditioning system is arranged to liquidly decouple the conditioning conduit from at least a part of the return conduit, in which part of the return conduit the pump is arranged.
6. The temperature conditioning system of clause 5, wherein the part of the return conduit is liquidly decoupled from the conditioning conduit by providing a first gas volume between the supply chamber inlet and the supply chamber outlet and/or providing a second gas volume between the discharge chamber inlet and the discharge chamber outlet.
7. The temperature conditioning system of clause 5 or 6, wherein the supply chamber has a first liquid level, wherein the supply chamber inlet is arranged above the first liquid level and the supply chamber outlet is arranged below the first liquid level, and/or
wherein the discharge chamber has a second liquid level, wherein the discharge chamber inlet is arranged above the first liquid level and the discharge chamber outlet is arranged below the second liquid level.
8. The temperature conditioning system of any of the preceding clauses, wherein the temperature conditioning system is arranged to maintain a first liquid level in the supply chamber at a constant height above the discharge chamber inlet to maintain a constant hydrostatic pressure difference between the supply chamber outlet and the discharge chamber inlet.
9. The temperature conditioning system of clause 8, wherein the supply chamber comprises an overflow line to control the first liquid level.
10. The temperature conditioning system of clause 9, wherein the overflow line comprises a gas liquid separator to separate gas entrained with liquid flowing into the overflow line from the liquid.
11. The temperature conditioning system of clause 10, wherein the gas liquid separator comprises a liquid trap construction.
12. The temperature conditioning system of clause 10 or 11, wherein the gas liquid separator comprises a gas return conduit connected to the gas liquid separator and the supply chamber to allow gas to flow back from the gas liquid separator to the supply chamber.
13. The temperature conditioning system of any of the clauses 10-12, wherein porous material is provided in a flow channel of the gas liquid separator to dampen the flow through the channel.
14. The temperature conditioning system of any of the clauses 10-13, wherein a vertical distance between the gas liquid separator and the supply chamber is smaller than 20% of a vertical distance between the first liquid level and the discharge chamber inlet.
15. The temperature conditioning system of clause 8, wherein the first liquid level is controlled by a body that is movable in vertical direction and extends partially into conditioning liquid in the supply chamber.
16. The temperature conditioning system of any of the clauses 1-15, wherein the temperature conditioning system comprises a gas pressure controller to control a gas pressure level in the supply chamber and the discharge chamber.
17. The temperature conditioning system of any of the clauses 1-15, wherein the temperature conditioning system comprises a first gas pressure controller to control a first gas pressure in the supply chamber, and wherein the temperature conditioning system comprises a second gas pressure controller to control a second gas pressure level in the discharge chamber.
18. The temperature conditioning system of any of the clauses 2 to 17, wherein the return conduit comprises a first valve downstream of the pump and a second valve upstream of the pump, wherein the conditioning conduit can be liquidly decoupled from the part of the return conduit by closing the first valve and the second valve.

19. The temperature conditioning system of clause 18, wherein the supply chamber comprises a main supply chamber and an auxiliary supply chamber connected to each other via a first connection conduit comprising a first connection valve and wherein the discharge chamber comprises a main discharge chamber and an auxiliary discharge chamber connected to each other via a second connection conduit comprising a second connection valve.

20. The temperature conditioning system of clause 18, wherein the main supply chamber can be liquidly decoupled from the part of the return conduit by closing the first valve and/or the first connection valve and the second valve and wherein the main discharge chamber can be liquidly decoupled from the part of the return conduit by closing the second valve and/or the second connection valve.

21. The temperature conditioning system of any of the clauses 18-20, wherein the temperature conditioning system comprises a first gas pressure controller to control a first gas pressure in the supply chamber, and wherein the temperature conditioning system comprises a second gas pressure controller to control a second gas pressure level in the discharge chamber.

22. The temperature conditioning system of any of the preceding clauses, wherein the supply chamber inlet and/or the discharge chamber inlet comprise inlet flow dampening devices to reduce the flow speed into the supply chamber and discharge chamber, respectively.

23. The temperature conditioning system of any of the preceding clauses, wherein the conditioning conduit, the supply chamber and/or discharge chamber is at least partly filled with foam material, porous material, mesh material and/or perforated material, or filled with multiple substantially parallel channels to reduce flow disturbances in the flow of conditioning liquid.

24. The temperature conditioning system of clause 23, wherein the foam material, porous material, mesh material and/or perforated material, or the multiple substantially parallel channels are provided at or near flow discontinuities, such as bends, constrictions and manifolds.

25. The temperature conditioning system of clause 23 or 24, wherein the foam material, porous material, mesh material and/or perforated material, or the multiple substantially parallel channels are provided in an inflow area of the supply chamber and/or provided in an inflow area of the discharge chamber.

26. The temperature conditioning system of any of the preceding clauses, wherein the temperature conditioning system comprises damping devices to reduce pressure fluctuations due to accelerations of parts of the liquid system caused by machine part vibrations and/or floor vibrations.

27. A lithographic apparatus comprising the temperature conditioning system of any of the preceding clauses, wherein the object is a part of the lithographic apparatus.

28. The lithographic apparatus of clause 27, wherein the object is a mirror element of a projection system.

29. A method of temperature conditioning an object using conditioning liquid in a temperature conditioning system, the temperature conditioning system comprising:

a conditioning conduit to guide conditioning liquid through or along the object, the conditioning conduit comprising a conditioning conduit inlet and a conditioning conduit outlet, a return conduit having a return conduit inlet and a return conduit outlet, a supply chamber having a supply chamber inlet connected to the return conduit outlet and a supply chamber outlet connected to the conditioning conduit inlet, and a discharge chamber having a discharge chamber inlet connected to the conditioning conduit outlet and a discharge chamber outlet connected to the return conduit inlet, wherein the method comprises providing a static pressure difference between the supply chamber outlet and the discharge chamber inlet to create a flow through the conditioning conduit, and maintaining a first pressure in the supply chamber and a second pressure in the discharge chamber at a sub-atmospheric pressure level.

30. The method of clause 29, wherein the supply chamber comprises a first gas volume and the discharge chamber comprises a second gas volume, wherein the first gas volume and the second gas volume have a volume of at least 0.5 liters.

31. The method of clause 29 or 30, wherein the method comprises simultaneously pumping conditioning liquid from the discharge chamber to the supply chamber through the return conduit, wherein the temperature conditioning system is arranged to dampen propagation of flow induced vibrations caused by the pump into the conditioning conduit.

32. The method of any of the clauses 29-31, the method comprising the step of maintaining a first liquid level in the supply chamber at a constant height above the discharge chamber inlet to maintain a constant hydrostatic pressure difference between the supply chamber outlet and the discharge chamber inlet.

33. The method of clause 32, wherein the step of maintaining a first liquid level in the supply chamber at a constant height above the discharge chamber inlet comprises using an overflow line in the supply chamber.

34. The method of clause 33, wherein the method comprises damping liquid flow in the overflow line using a gas liquid separator in order to separate gas entrained with liquid flowing into the overflow line from the liquid.

35. The method of any of the clauses 29-34, wherein the temperature conditioning system comprises a gas pressure controller to control a gas pressure level in the supply chamber and the discharge chamber, wherein the method comprises controlling the gas pressure level in the supply chamber and the discharge chamber at a sub-atmospheric level.

36. The method of any of the clauses 29-35, wherein the temperature conditioning system comprises a first gas pressure controller to control a first gas pressure in the supply chamber, and wherein the temperature conditioning system comprises a second gas pressure controller to control a second gas pressure level in the discharge chamber and wherein the method comprises controlling the first gas pressure and the second gas pressure to create a static pressure difference between the supply chamber outlet and the discharge chamber.

37. The method of any of the clauses 29-36, wherein the return conduit comprises a first valve downstream of the pump and a second valve upstream of the pump, wherein the method comprises liquidly decoupling the conditioning conduit from the part of the return conduit by closing the first valve and the second valve.

38. The method of clause 37, wherein the supply chamber comprises a main supply chamber and an auxiliary supply sub-chamber connected to each other via a first connection conduit comprising a first connection valve and wherein the discharge chamber comprises a main discharge chamber and an auxiliary discharge chamber connected to each other via a second connection conduit comprising a second connection valve, the method comprises alternately: applying a static pressure difference between the supply chamber outlet and the discharge chamber inlet to create a flow from the supply chamber to the discharge chamber, while the conditioning conduit is liquidly decoupled from the part of the return conduit by closing the first valve and the second valve, whereby the first connection valve and the second connection valve are opened, and applying a static pressure difference between the supply chamber outlet and the discharge chamber inlet to create a flow from the main supply chamber to the main discharge chamber, while the conditioning conduit is liquidly decoupled from the part of the return conduit by closing the first connection valve and the second connection valve, whereby the first valve and the second valve are opened and conditioning liquid is pumped by the pump from the auxiliary discharge chamber to the auxiliary supply chamber.

The invention claimed is:

1. A temperature conditioning system using conditioning liquid to condition a temperature of an object, the temperature conditioning system comprising:
    a conditioning conduit to guide conditioning liquid through or along the object, the conditioning conduit comprising a conditioning conduit inlet and a conditioning conduit outlet,
    a return conduit having a return conduit inlet and a return conduit outlet,
    a supply chamber having a supply chamber inlet connected to the return conduit outlet and a supply chamber outlet connected to the conditioning conduit inlet, and
    a discharge chamber having a discharge chamber inlet connected to the conditioning conduit outlet and a discharge chamber outlet connected to the return conduit inlet,
    wherein a first pressure in the supply chamber and a second pressure in the discharge chamber are held at a sub-atmospheric pressure level, and
    wherein the temperature conditioning system is arranged to provide a static pressure difference between the supply chamber outlet and the discharge chamber inlet to create a flow through the conditioning conduit.

2. The temperature conditioning system of claim 1, wherein the return conduit comprises a pump configured to pump conditioning liquid from the discharge chamber to the supply chamber, and
    wherein the temperature conditioning system is arranged to dampen propagation of flow induced vibrations caused by the pump into the conditioning conduit.

3. The temperature conditioning system of claim 2, wherein the temperature conditioning system is arranged to liquidly decouple the conditioning conduit from at least a part of the return conduit, in which part of the return conduit the pump is arranged, and
    wherein the part of the return conduit being is liquidly decoupled from the conditioning conduit by providing a gas volume between the supply chamber inlet and the supply chamber outlet and/or providing a gas volume between the discharge chamber inlet and the discharge chamber outlet, and/or
    wherein the supply chamber has a first liquid level, the supply chamber inlet is arranged above the first liquid level and the supply chamber outlet is arranged below the first liquid level, and/or
    wherein the discharge chamber has a second liquid level, the discharge chamber inlet is arranged above the first liquid level and the discharge chamber outlet is arranged below the second liquid level.

4. The temperature conditioning system of claim 1, wherein the temperature conditioning system is arranged to maintain a first liquid level in the supply chamber at a constant height above the discharge chamber inlet to maintain a constant hydrostatic pressure difference between the supply chamber outlet and the discharge chamber inlet, and
    wherein the supply chamber comprises an overflow line to control the first liquid level, and/or
    wherein the first liquid level is controlled by a body that is movable in vertical direction and extends partially into conditioning liquid in the supply chamber.

5. The temperature conditioning system of claim 1, further comprising a gas pressure controller to control a gas pressure level in the supply chamber and the discharge chamber.

6. The temperature conditioning system of claim 1, further comprising a first gas pressure controller to control a first gas pressure in the supply chamber, and a second gas pressure controller to control a second gas pressure level in the discharge chamber.

7. The temperature conditioning system of claim 2, wherein the return conduit comprises a first valve downstream of the pump and a second valve upstream of the pump, wherein the conditioning conduit can be liquidly decoupled from the part of the return conduit by closing the first valve and the second valve.

8. The temperature conditioning system of claim 7, wherein the supply chamber comprises a main supply chamber and an auxiliary supply chamber connected to each other via a first connection conduit comprising a first connection valve and wherein the discharge chamber comprises a main discharge chamber and an auxiliary discharge chamber connected to each other via a second connection conduit comprising a second connection valve.

9. The temperature conditioning system of claim 7, wherein the main supply chamber is configured to be able to be liquidly decoupled from the part of the return conduit by closing the first valve and/or the first connection valve and the second valve and wherein the main discharge chamber is configured to be able to can be liquidly decoupled from the part of the return conduit by closing the second valve and/or the second connection valve.

10. The temperature conditioning system of claim 7, wherein the temperature conditioning system comprises a first gas pressure controller to control a first gas pressure in the supply chamber, and wherein the temperature conditioning system comprises a second gas pressure controller to control a second gas pressure level in the discharge chamber.

11. The temperature conditioning system of claim 1, wherein the supply chamber inlet and/or the discharge chamber inlet comprise inlet flow dampening devices to reduce the flow speed into the supply chamber and discharge chamber, respectively.

12. The temperature conditioning system of claim 1, wherein the conditioning conduit, the supply chamber and/or discharge chamber is at least partly filled with foam material, porous material, mesh material and/or perforated material, or filled with multiple substantially parallel channels to reduce flow disturbances in the flow of conditioning liquid.

13. A lithographic apparatus comprising the temperature conditioning system of claim 1, wherein the object is a part of the lithographic apparatus.

14. A method of temperature conditioning an object using conditioning liquid in a temperature conditioning system, the temperature conditioning system comprising: a conditioning conduit to guide conditioning liquid through or along the object, the conditioning conduit comprising a conditioning conduit inlet and a conditioning conduit outlet; a return conduit having a return conduit inlet and a return conduit outlet; a supply chamber having a supply chamber inlet connected to the return conduit outlet and a supply chamber outlet connected to the conditioning conduit inlet; and a discharge chamber having a discharge chamber inlet connected to the conditioning conduit outlet and a discharge chamber outlet connected to the return conduit inlet, the method comprising:
providing a static pressure difference between the supply chamber outlet and the discharge chamber inlet to create a flow through the conditioning conduit, and
maintaining a first pressure in the supply chamber and a second pressure in the discharge chamber at a subatmospheric pressure level.

15. The method of the claim 14, further comprising simultaneously pumping, using a pump, conditioning liquid from the discharge chamber to the supply chamber through the return conduit, and
wherein the return conduit comprises a first valve downstream of the pump and a second valve upstream of the pump, wherein the method comprises liquidly decoupling the conditioning conduit from the part of the return conduit by closing the first valve and the second valve, and
wherein the supply chamber comprises a main supply chamber and an auxiliary supply sub-chamber connected to each other via a first connection conduit comprising a first connection valve and wherein the discharge chamber comprises a main discharge chamber and an auxiliary discharge chamber connected to each other via a second connection conduit comprising a second connection valve, the method comprises alternately:
applying a static pressure difference between the supply chamber outlet and the discharge chamber inlet to create a flow from the supply chamber to the discharge chamber, while the conditioning conduit is liquidly decoupled from the part of the return conduit by closing the first valve and the second valve, wherein the first connection valve and the second connection valve are opened, or
applying a static pressure difference between the supply chamber outlet and the discharge chamber inlet to create a flow from the main supply chamber to the main discharge chamber, while the conditioning conduit is liquidly decoupled from the part of the return conduit by closing the first connection valve and the second connection valve, wherein the first valve and the second valve are opened and conditioning liquid is pumped by the pump from the auxiliary discharge chamber to the auxiliary supply chamber.

16. The method of claim 15, wherein the supply chamber comprises a first gas volume and the discharge chamber comprises a second gas volume, wherein the first gas volume and the second gas volume have a volume of at least 0.5 liters.

17. The method of claim 15, further comprising simultaneously pumping, using a pump, conditioning liquid from the discharge chamber to the supply chamber through the return conduit, wherein the temperature conditioning system is arranged to dampen propagation of flow induced vibrations caused by the pump into the conditioning conduit.

18. The method of claim 15, further comprising maintaining a first liquid level in the supply chamber at a constant height above the discharge chamber inlet to maintain a constant hydrostatic pressure difference between the supply chamber outlet and the discharge chamber inlet.

19. The method of claim 18, wherein the maintaining a first liquid level in the supply chamber at a constant height above the discharge chamber inlet comprises using an overflow line in the supply chamber.

20. The method of claim 15, wherein the return conduit comprises a first valve downstream of a pump and a second valve upstream of the pump, and further comprising liquidly decoupling the conditioning conduit from a part of the return conduit by closing the first valve and the second valve.

* * * * *